(12) United States Patent
Becker et al.

(10) Patent No.: US 12,046,443 B2
(45) Date of Patent: Jul. 23, 2024

(54) SHIELD FOR FILAMENT IN AN ION SOURCE

(71) Applicant: Applied Materials, Inc., Santa Clara, CA (US)

(72) Inventors: Klaus Becker, Kensington, NH (US); Luigi G. Amato, Hampton Falls, NH (US); Elvis Gomez, Atkinson, NH (US); David Burgdorf, Rockport, MA (US); Victor Theriault, Hamilton, MA (US); Thomas Stewart, Nelson (CA)

(73) Assignee: Applied Materials, Inc., Santa Clara, CA (US)

( * ) Notice: Subject to any disclaimer, the term of this patent is extended or adjusted under 35 U.S.C. 154(b) by 15 days.

(21) Appl. No.: 17/532,358

(22) Filed: Nov. 22, 2021

(65) Prior Publication Data
US 2023/0162941 A1    May 25, 2023

(51) Int. Cl.
*H01J 37/08* (2006.01)
*H01J 37/09* (2006.01)
*H01J 37/317* (2006.01)

(52) U.S. Cl.
CPC ............. *H01J 37/08* (2013.01); *H01J 37/09* (2013.01); *H01J 37/3171* (2013.01)

(58) Field of Classification Search
CPC ........ H01J 37/08; H01J 27/08; H01J 37/3171; H01J 2237/31701; H01J 27/14;
(Continued)

(56) References Cited

U.S. PATENT DOCUMENTS 4,486,665 A * 12/1984 Leung ................. H01J 27/028
                                                          376/129
5,198,677 A *  3/1993 Leung ................... H01J 27/14
                                                          250/424
(Continued)

FOREIGN PATENT DOCUMENTS

JP    H04315734 A * 11/1992
JP    H06111723 A *  4/1994
(Continued)

OTHER PUBLICATIONS

JP-2007242460-A, machine translation (Year: 2023).*
(Continued)

*Primary Examiner* — Michael J Logie
(74) *Attorney, Agent, or Firm* — NIELDS, LEMACK & FRAME, LLC

(57) ABSTRACT

A Bernas ion source having a shield is disclosed. The shield is disposed between the distal portion of the filament and the first end of the chamber and serves to confine the plasma to the region between the shield and the second end of the chamber. The shield may be electrically connected to the negative leg of the filament so as to be the most negatively biased component in the chamber. In other embodiments, the shield may be electrically floating. In this embodiment, the shield may self-bias. The shield is typically made of a refractory metal. The use of the shield may reduce back heating of the filament by the plasma and reduce the possibility for thermal runaway. This may allow denser plasmas to be generated within the chamber.

10 Claims, 4 Drawing Sheets

(58) Field of Classification Search
CPC ......... H01J 2237/30472; H01J 2237/08; H01J 2237/026; H01J 37/09; H01J 1/26; H01J 2237/032; H01J 2237/038; H01J 2237/082; H01J 27/022; H01J 27/04; H01J 2237/24535; H01J 2237/24542; H01J 2237/31703; H01J 27/22; H01J 1/20; H01J 1/50; H01J 2237/0048; H01J 2237/0206; H01J 2237/0213; H01J 2237/022; H01J 2237/024; H01J 2237/0455; H01J 2237/061; H01J 2237/06316; H01J 2237/06325; H01J 2237/06375; H01J 2237/0653; H01J 2237/0815; H01J 2237/0827; H01J 2237/24507; H01J 2237/24521; H01J 2237/2482; H01J 2237/31705; H01J 27/00; H01J 27/02; H01J 27/028; H01J 27/10; H01J 27/16; H01J 27/18; H01J 37/023; H01J 37/065; H01J 37/16; H01J 37/24; H01J 37/248; H01J 37/3007; H01J 37/304; H01J 37/3174; H01J 37/32009; H01J 37/32055; H01J 37/32477; H01J 49/0086; H01J 49/305

See application file for complete search history.

(56) References Cited

U.S. PATENT DOCUMENTS

| | | | | |
|---|---|---|---|---|
| 5,262,652 | A * | 11/1993 | Bright | H01J 27/18 250/424 |
| 5,543,625 | A * | 8/1996 | Johnson | H01J 49/147 250/427 |
| 2002/0053880 | A1 * | 5/2002 | Miyamoto | H01J 27/14 315/111.41 |
| 2004/0104682 | A1 | 6/2004 | Horsky et al. | |
| 2006/0284104 | A1 * | 12/2006 | Fujita | H01J 27/14 250/423 R |
| 2007/0132358 | A1 | 6/2007 | Chen | |
| 2007/0259130 | A1 * | 11/2007 | Von Kaenel | H01J 37/32009 118/723 R |
| 2009/0032702 | A1 * | 2/2009 | Quarmby | H01J 49/147 313/341 |
| 2009/0211896 | A1 * | 8/2009 | Devaney | H01J 37/3171 204/298.04 |
| 2010/0051825 | A1 | 3/2010 | Yamashita et al. | |
| 2011/0101213 | A1 * | 5/2011 | Satoh | H01J 37/08 250/282 |
| 2019/0287775 | A1 | 9/2019 | Newton et al. | |
| 2019/0385830 | A1 | 12/2019 | Mous | |

FOREIGN PATENT DOCUMENTS

| | | | |
|---|---|---|---|
| JP | 11-54059 A | | 2/1999 |
| JP | 2007242460 A | * | 9/2007 |
| JP | 2007-280782 A | | 10/2007 |
| TW | 511113 B | | 11/2002 |
| WO | 2016/092368 A2 | | 6/2016 |

OTHER PUBLICATIONS

Kuo et al., "On the Development of a 15 mA Direct Current H-Multicusp Source", Review of Scientific Instruments, vol. 67, pp. 1314-1316, 1996.

International Search Report and Written Opinion mailed Feb. 22, 2023 in corresponding PCT application No. PCT/US2022/047350.

Lee et al., A compact filament-driven multicusp ion source. Nuclear Instruments and Methods in Physics Research Section B: Beam Interactions with Materials and Atoms. vol. 119, Issue 4, pp. 543-548, Dec. 1, 1996.

* cited by examiner

SHIELD FOR FILAMENT IN AN ION SOURCE

FIELD

Embodiments of the present disclosure relate to shields for a filament, and more particularly a filament in a Bernas source.

BACKGROUND

Semiconductor devices are fabricated using a plurality of processes, some of which implant ions into the workpiece. Various ion sources may be used to create the ions. One such ion source is a Bernas ion source. A Bernas ion source comprises a filament disposed in a chamber. As current is passed through the filament, the filament emits thermionic electrons into the chamber of the ion source. The filament is disposed at one end of a chamber. An extraction aperture may be disposed on the end opposite the filament.

In certain embodiment, a particular configuration of a Bernas ion source, referred to as a multicusp ion source, may be utilized to generate negative ions, and more particularly negative hydrogen ions.

Because the filament is directly exposed to the plasma, it may be back heated by the energetic ions in the plasma. At high plasma densities, this may cause the filament to become hotter than desired, potentially causing thermal runaway. Thus, in certain embodiments, active control of the current passing through the filament is performed. However, this complicates the control of the ion source and may result in instabilities.

Therefore, it would be beneficial if there was a Bernas ion source in which the back heating of the filament could be controlled so as minimize the possibility of thermal runaway. It would be advantageous if this system could be readily incorporated in existing Bernas and multicusp ion sources.

SUMMARY

A Bernas ion source having a shield is disclosed. The shield is disposed between the distal portion of the filament and the first end of the chamber and serves to confine the plasma to the region between the shield and the second end of the chamber. The shield may be electrically connected to the negative leg of the filament so as to be the most negatively biased component in the chamber. In other embodiments, the shield may be electrically floating. In this embodiment, the shield may self-bias. The shield is typically made of a refractory metal. The use of the shield may reduce back heating of the filament by the plasma and reduce the possibility for thermal runaway. This may allow denser plasmas to be generated within the chamber.

According to one embodiment, an ion source is disclosed. The ion source comprises a chamber comprising a first end, a second end and walls connecting the first end and the second end, the second end having an extraction aperture; a filament disposed in the chamber, extending from the first end and having a negative leg, a second leg and a distal portion connected to the negative leg and the second leg; a filament power supply in communication with the negative leg and the second leg; and a shield disposed between the first end and the distal portion of the filament, wherein the shield is electrically connected to the negative leg. In some embodiments, the ion source comprises an electrode disposed outside the chamber and proximate the extraction aperture, having an electrode aperture; and an electrode power supply to provide a voltage to the electrode. In certain embodiments, the electrode is biased positively relative to the chamber so as to attract negative ions and electrodes through the extraction aperture. In some embodiments, the ion source is a multicusp ion source and comprises magnets disposed along the walls. In certain embodiments, the shield comprises a round plate. In certain embodiments, the shield comprises a metal mesh or a plate comprising a plurality of holes. In some embodiments, the filament comprises a plurality of filament elements, disposed at different heights, and wherein the shield comprises a multitier structure. In some embodiments, the multitier structure comprises a lower tier comprising a cylinder having a first height and a first diameter; and an upper tier comprising a concentric cylinder having a second height and a second diameter, smaller than the first diameter.

According to another embodiment, an ion implantation system is disclosed. The ion implantation system comprises the ion source described above; a mass analyzer to receive ions extracted from the ion source; and a tandem accelerator to accelerate ions exiting the mass analyzer.

According to another embodiment, an ion source is disclosed. The ion source comprises a chamber comprising a first end, a second end and walls connecting the first end and the second end, the second end having an extraction aperture; a filament disposed in the chamber, extending from the first end and having a negative leg, a second leg and a distal portion connected to the negative leg and the second leg; a filament power supply in communication with the negative leg and the second leg; and a shield disposed between the first end and the distal portion of the filament, wherein the shield is a refractory metal. In some embodiments, the shield is electrically connected to the negative leg. In some embodiments, the shield is electrically floating. In some embodiments, the ion source comprises an electrode disposed outside the chamber and proximate the extraction aperture, having an electrode aperture; and an electrode power supply to provide a voltage to the electrode. In certain embodiments, the electrode is biased positively relative to the chamber so as to attract negative ions and electrodes through the extraction aperture. In some embodiments, the ion source is a multicusp ion source and comprises magnets disposed along the walls. In certain embodiments, the shield comprises a round plate. In certain embodiments, the shield comprises a metal mesh or a plate comprising a plurality of holes. In some embodiments, the filament comprises a plurality of filament elements, disposed at different heights, and wherein the shield comprises a multitier structure. In some embodiments, the multitier structure comprises a lower tier comprising a cylinder having a first height and a first diameter; and an upper tier comprising a concentric cylinder having a second height and a second diameter, smaller than the first diameter.

According to another embodiment, an ion implantation system is disclosed. The ion implantation system comprises the ion source described above; a mass analyzer to receive ions extracted from the ion source; and a tandem accelerator to accelerate ions exiting the mass analyzer.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
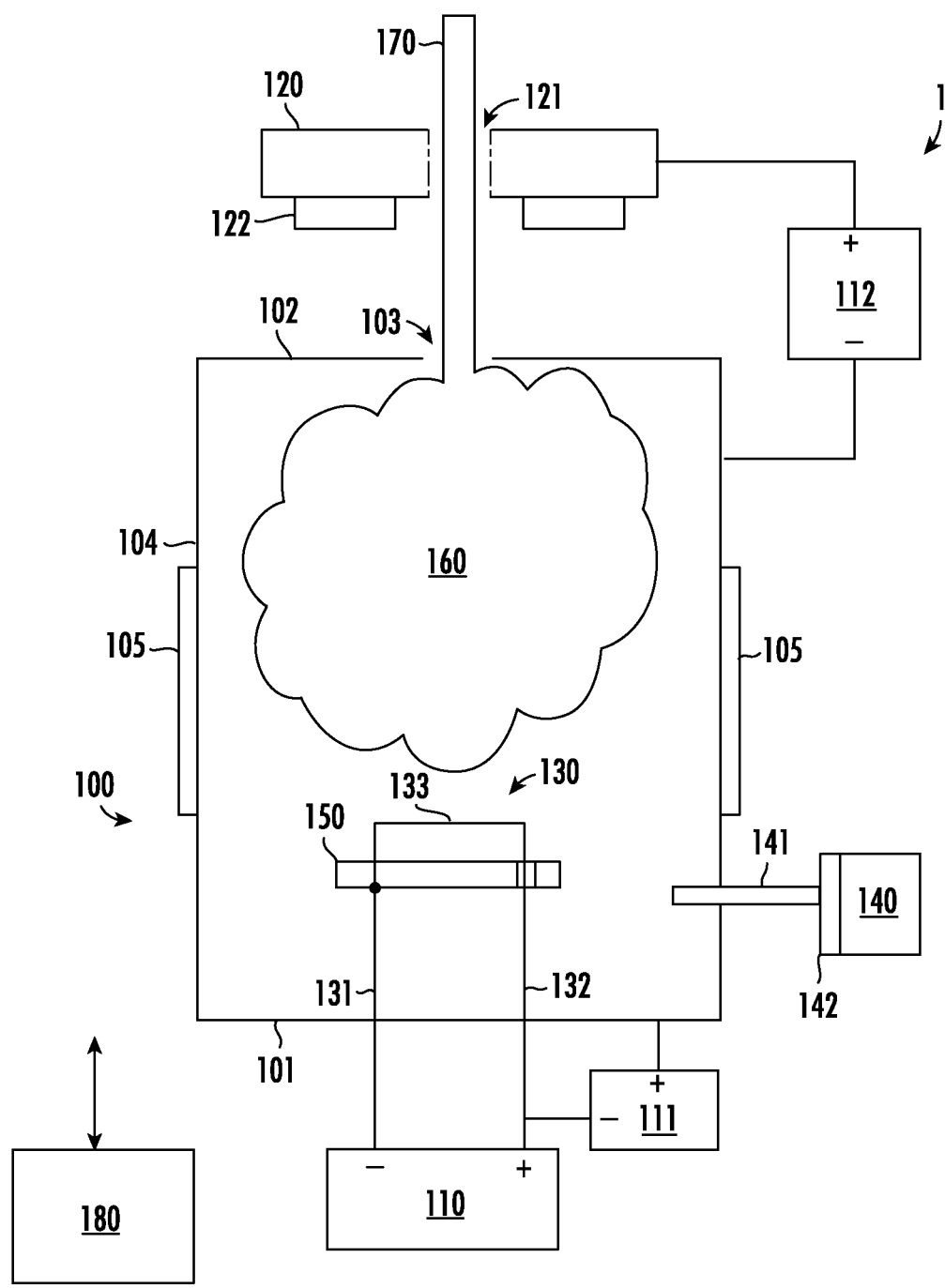
FIG. 1 shows a block diagram of a multicusp ion source according to one embodiment.

FIG. 1 shows a cross-sectional view of a Bernas ion source. A Bernas ion source is one in which electrons from the heated filament directly enter the chamber to create the plasma. Thus, unlike an indirectly heated cathode (IHC) ion source, the filament of a Bernas ion source is not shielded by a cathode, but rather is exposed directly to the plasma. One specific type of Bernas ion source is a multicusp ion source, where magnets are used to create a magnetic field within the chamber. FIG. 1 illustrates a Bernas ion source 1 that may be utilized to extract ions according to one embodiment. In one particular embodiment, the extracted ions may be negatively charged. The Bernas ion source may be a multicusp ion source. The multicusp ion source includes a chamber 100, comprising two opposite ends, and walls 104 connecting to these ends. In one embodiment, the walls 104 may be cylindrical. The walls 104 of the chamber 100 may be constructed of an electrically conductive material and may be in electrical communication with one another. In some embodiments, the walls 104 may be constructed from a refractory metal.

A filament 130 extends into the chamber 100 from one end, referred to as the first end 101. The opposite end, or second end 102, includes the extraction aperture 103.

Ions are extracted through the extraction aperture 103. An electrode 120 is disposed outside the chamber 100, proximate the extraction aperture 103. The electrode 120 includes an electrode aperture 121 which is aligned with the extraction aperture 103.

The electrode 120 may be electrically biased to attract ions from the plasma 160 through the extraction aperture 103. An electrode power supply 112 may be used to bias the electrode 120 relative to the chamber 100. In certain embodiments, the electrode power supply 112 is configured such that the electrode 120 is more positive than the chamber 100. In this way, negatively charged ions and electrons are drawn through the extraction aperture 103 and through the electrode aperture 121. In some embodiments, filter elements 122, such as magnets or electrodes, may be disposed on the electrode 120 or between the electrode 120 and the second end 102. The filter elements 122 serve to repel or redirect the electrons that are extracted from the chamber 100 such that most of the electrons do not pass through the electrode aperture 121. In this way, the beam 170 that is extracted through the electrode aperture 121 comprises mostly negative ions. In some embodiments, the beam current may be up to 100 mA.

The filament 130 is disposed near the first end 101 and has a negative leg 131, a second leg 132 and a distal portion 133 that extends furthest into the chamber 100. The negative leg 131 and the second leg 132 are each in communication with a filament power supply 110. The negative leg 131 is more negative than the second leg 132. The filament power supply 110 is configured to pass a current through the filament 130, such that the distal portion 133 emits thermionic electrons. This current may be up to 100 A or more.

The second leg 132 is in communication with an arc voltage power supply 111. The arc voltage power supply 111 supplies a voltage to the second leg 132 relative to the chamber 100. This may be a negative voltage, such as between 40 and 200 V. This arc voltage accelerates the thermionic electrons emitted by the filament 130 into chamber 100 to ionize the neutral gas. The current drawn by this arc voltage power supply 111 may be a measurement of the amount of current being driven through the plasma 160. In certain embodiments, the walls 104 provide the ground reference for the other power supplies.

In certain embodiments, magnets 105 are disposed around the outside of the walls 104 to create a multi-cusp magnetic field within the chamber 100. For example, a plurality of magnetic bars may be used to create the cusp lines within the chamber 100. The magnetic bars may be samarium cobalt, although other materials may be used.

Advantageously, the multicusp ion source also comprises a shield 150. The shield 150 may be constructed from a refractory metal, such as tungsten or molybdenum. The shield 150 is disposed between the distal portion 133 of the filament 130 and the first end 101. In certain embodiments, the shield 150 is electrically connected to the negative leg 131 of the filament 130. In this way, the shield 150 is the most negatively biased component in the chamber 100. The shield 150 may be dimensioned so as to extend radially further than the distal portion 133. The shape of the shield 150 may depend on geometry of the chamber 100 and the filament 130. In a cylindrical chamber with a circular or near circular filament, the shield 150 may be a round plate. A round plate may have small holes or be a mesh to reduce weight. In the embodiment shown in FIG. 1, the cross-section of the shield 150 may be planar on the two opposite surfaces. The shield 150 may be rectangular, square, circular or any other suitable shape.

A controller 180 may be in communication with one or more of the power supplies such that the voltage or current supplied by these power supplies may be monitored and/or modified. Additionally, the controller 180 may be in communication with the mass flow controller 142 of the gas container 140 so as to regulate a flow of gas into the chamber 100. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

For example, the controller 180 may be in communication with the filament power supply 110 to control the current passing through the filament 130. Additionally, the controller 180 may be in communication with the arc voltage power supply 111 to allow the multicusp ion source to vary the voltage applied to the second leg 132 of the filament 130 relative to the chamber 100. Further, the controller 180 may be able to monitor and adjust the voltage supplied by electrode power supply 112.

In operation, gas from gas container 140 is introduced into the chamber 100 through gas inlet 141. The gas may be any suitable species, such as hydrogen. The flow of gas may be regulated by a mass flow controller 142.

The arc voltage power supply 111 is used to bias the second leg 132 of the filament 130 negatively relative to the chamber 100. The filament power supply 110 is used to supply current through the filament 130. The amount of current may be up to 350 A. In certain embodiments, the current may be at least 100 A. The current causes the filament 130 to heat, emitting thermionic electrons into the chamber 100. Since the filament 130 is negatively biased relative to the chamber 100, the electrons are accelerated away from the filament 130. These emitted electrons interact with the gas to create a plasma 160. The shape of the plasma 160 within the chamber 100 is controlled by the magnets 105, the electric field between filament 130 and walls 104, and optional additional electrodes that are immersed in the plasma.

Electrode power supply 112 is used to bias the electrode 120 positively relative to the chamber 100 and the plasma 160. In this way, negative particles, such as electrons and negative ions, are drawn through the extraction aperture 103 and toward the electrode aperture 121. In some embodiments, filter elements 122 are disposed between the electrode 120 and the second end 102 to redirect any electrons that are extracted. For example, a magnetic field may be created by the filter elements 122. The field may be of such a strength that its effect on heavier negative ions is minimal, but electrons, which may have a mass that is at least 1000 times less than the negative ions, are deflected or repelled. In this way, the negative particles that pass through the electrode aperture 121 are mostly negative ions.

Figure 2:
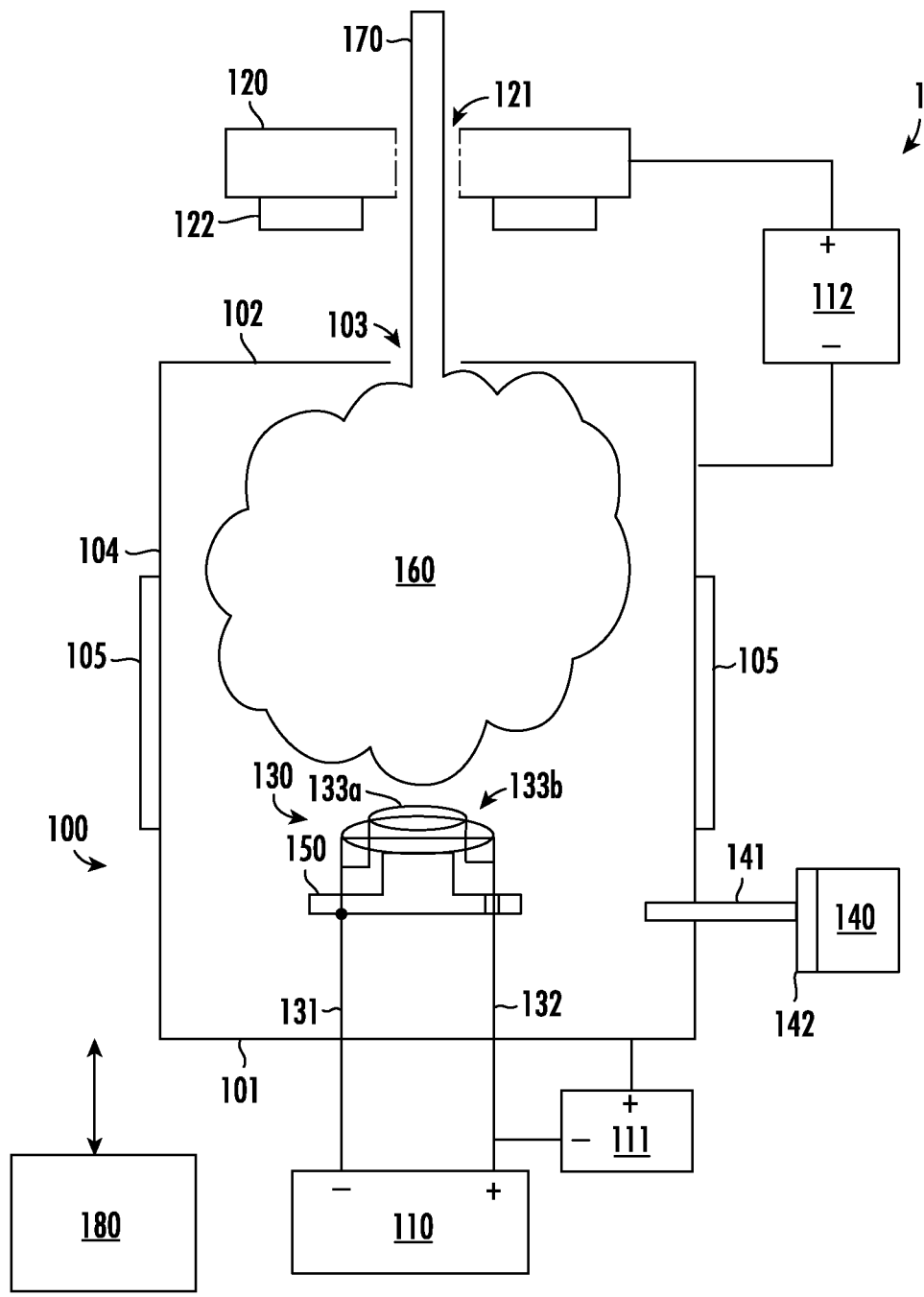
FIG. 2 shows a block diagram of a multicusp ion source according to a second embodiment.
Figure 3:
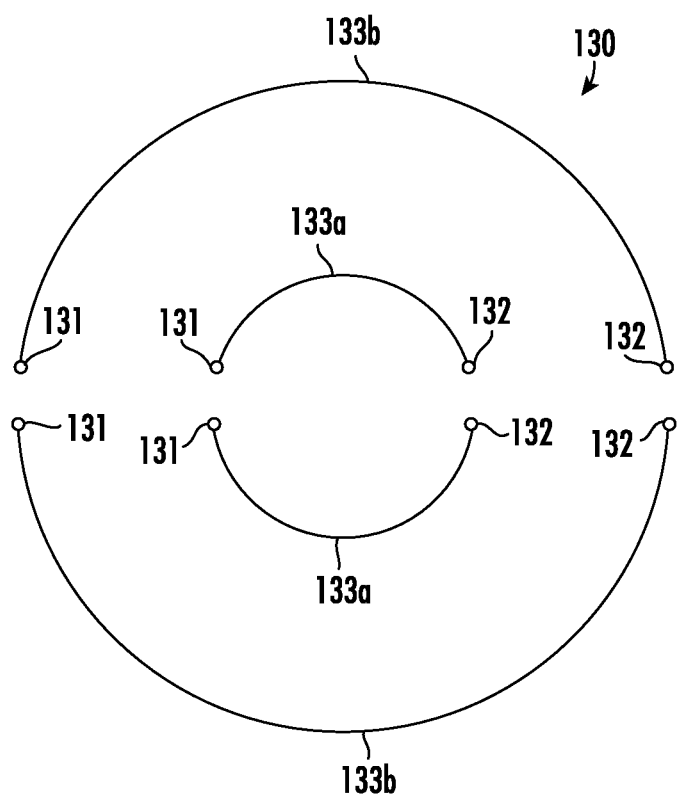
FIG. 3 shows a top view of a filament according to one embodiment.

FIG. 2 shows the multicusp ion source according to another embodiment. Components that are the same as those in FIG. 1 have been given identical reference designators. In this embodiment, as can be seen in FIG. 3, the filament 130 comprises four separate filament elements which are all configured in parallel. The distal portion of each filament element is a semicircle. Further, the inner distal portions 133a of two of these filament elements extend further into the chamber 100 than the outer distal portions 133b of the other two elements. Further, the diameter of the inner distal portions 133a may be smaller than the diameter of the outer distal portions 133b.

Therefore, in this embodiment, the shield 150 may be multitiered. In one embodiment, the shield 150 may be shaped to have two tiers. The lower tier may be a cylinder having a first height and a first diameter. The upper tier may be a concentric cylinder having a second height and a second diameter, smaller than the first diameter. The first height may be larger, smaller or equal to the second height. The second height may be related to the distance between the inner distal portions 133a and the outer distal portions 133b.

While the shield 150 is described in FIGS. 1 and 2 as being connected to the negative leg 131 of the filament 130, other embodiments are also possible. For example, in one embodiment, the shield 150 may be electrically floating. In this embodiment, the shield 150 may self-bias to a negative voltage that restricts the plasma 160 to the region in front of the shield 150.

The above describes the ion source as being a multicusp ion source. However, other ion sources may also be used with the shield 150. For example, any Bernas ion source may also utilize the shield described herein.

Figure 4:
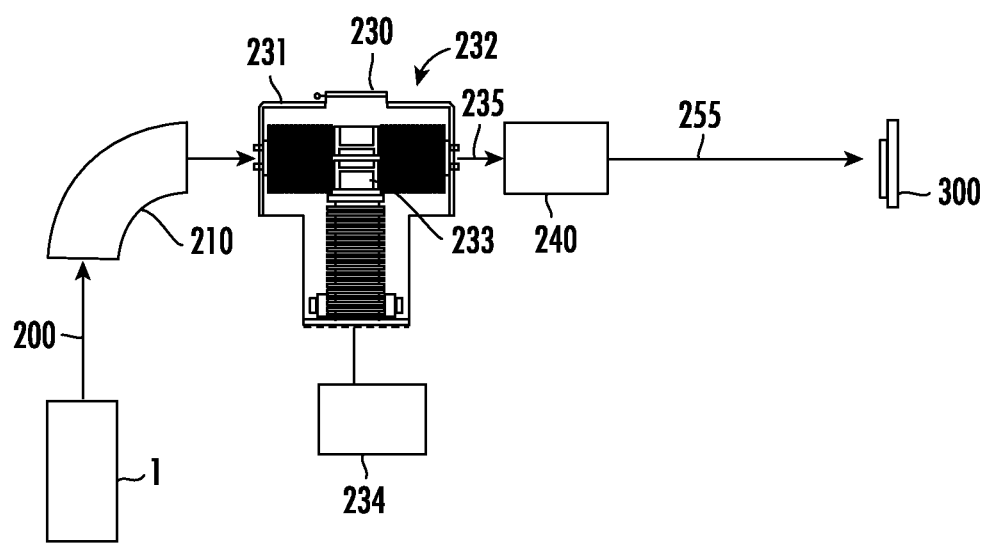
FIG. 4 shows an ion implantation system that utilizes the multicusp ion source.

This multicusp ion source with the shield 150 may be part of an ion implantation system. FIG. 4 shows such a system. The ion implantation system comprises a Bernas ion source 1, which may be the multicusp ion source with the shield 150. The multicusp ion source with the shield 150 is used to generate a negative ion beam 200. A feedgas is supplied to the Bernas ion source 1, which is then energized to generate ions. In certain embodiments, the feedgas may be hydrogen or another suitable species. Extraction optics are then used to extract these ions from the Bernas ion source 1.

The negative ion beam 200 may be directed toward a mass analyzer 210, which only allows the passage of certain species of ions. The negative ions that exit the mass analyzer 210 are directed toward a tandem accelerator 230.

The tandem accelerator 230 has two pathways, which are separated by a stripper tube 233. The input pathway 231 comprises a plurality of input electrodes. These input electrodes may be any suitable electrically conductive material, such as titanium or other metals. The outermost input electrode may be grounded. Each of the subsequent input electrodes may be biased at an increasingly more positive voltage moving closer to the stripper tube 233.

The input pathway 231 leads to the stripper tube 233. The stripper tube 233 is biased positively relative to the outermost input electrode. The stripper tube 233 includes an injection conduit where a stripper gas is injected. The stripper gas may comprise neutral molecules. These neutral molecules may be any suitable species such as, but not limited to argon and nitrogen. The stripper tube 233 has an inlet disposed on the same side as the input pathway 231. The outlet of the stripper tube 233 is in communication with the output pathway 232.

In other words, the stripper tube 233 is positively biased so as to attract the negative ion beam 200 through the input pathway 231. The stripper tube 233 removes electrons from the incoming ions, transforming them from negative ions into positive ions.

The stripper tube 233 is more positive than the electrodes in the output pathway 232. Each subsequent output electrode may be less positively biased moving away from the stripper tube 233. For example, the outermost output electrode may be grounded. Thus, the positive ions in the stripper tube 233 are accelerated through the output pathway 232.

In this way, the ions are accelerated two times. First, negative ions are accelerated through the input pathway 231 to the stripper tube 233. This acceleration is based on the difference between the voltage of the outermost input electrode and the voltage of the stripper tube 233. Next, positive ions are accelerated through the output pathway 232. This acceleration is based on the difference between the voltage of the stripper tube 233 and the voltage of the outermost output electrode in the output pathway 232.

An accelerator power supply 234 may be used to supply the voltages to the stripper tube 233, as well as the electrodes in the input pathway 231 and the output pathway 232. The accelerator power supply 234 may be capable of supply a voltage up to 2.5 MV, although other voltages, either higher or lower, are also possible. Thus, to modify the implant energy, the voltage applied by the accelerator power supply 234 is changed.

After exiting the tandem accelerator 230, the positive ion beam 235 may enter a filter magnet 240, which allows passage of ions of only a certain charge. In other embodiments, the filter magnet 240 may not be employed.

The output of the filter magnet, which may be a spot ion beam 255, is then directed toward the workpiece 300.

The present system has many advantages. In Bernas ion sources, the filament 130 is heated due to the current supplied by the filament power supply 110 and by the bombardment of the filament 130 with ions from the plasma 160. In traditional Bernas ion sources, which do not include a shield 150, the plasma 160 is disposed on both sides of the distal portions of the filament 130. Consequently, there may be significant heating from the plasma 160. At higher plasma densities, the heating from the plasma 160 may reach a level where the filament 130 becomes hotter than intended and therefore, generates more electrons. These additional electrons cause the plasma 160 to become more dense, and the denser plasma further heats the filament 130. This situation may be referred to as thermal runaway. However, by including the shield 150, the plasma 160 is confined to the region in front of the shield 150, which is the region between the shield 150 and the second end 102. This reduces the interaction between the plasma 160 and the filament 130. Further, the shield 150 may serve as a sink for some of the positive ions that are attracted toward the filament 130, reducing the number of ions that strike the filament 130. In one test, it was found that, without the shield, the extracted beam 170 may be about 2 mA before active control of the filament power supply 110 is used to prevent thermal runaway. This active control may be a PID controller. When the shield of FIG. 1 was added to the multicusp ion source, the extracted beam 170 may be more than more than 6 mA without the use of a PID controller. Thus, the use of the shield 150 may allow denser plasmas to be created without causing thermal runaway that currently exists.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source comprising:
    a chamber comprising a first end, a second end and walls connecting the first end and the second end, the second end having an extraction aperture;
    a filament disposed in the chamber, comprising a first pair of filament elements and a second pair of filament elements, wherein each filament element has a negative leg, a second leg and a distal portion connected to the negative leg and the second leg, wherein each distal portion is directly exposed to a plasma disposed in the chamber;
    wherein the first pair of filament elements and the second pair of filament elements extend into the chamber from the first end, wherein distal portions of the first pair of filament elements extend further into the chamber than distal portions of the second pair of filament elements, wherein the distal portion of each filament element comprises a semicircle and wherein the distal portions of each pair of filament elements form a portion of a circumference of a circle; wherein the circle formed by the first pair of filament elements has a diameter, smaller than a diameter of the circle formed by second pair of filament elements;
    a filament power supply in communication with the negative leg and the second leg of each filament element; and
    a shield, wherein the shield is a refractory metal and comprises a lower tier comprising a cylinder having a first height and a first diameter, disposed between the first end and the distal portion of the second pair of filament elements; and an upper tier, disposed above the lower tier, which extends further into the chamber than the lower tier, comprising a concentric cylinder which is an uppermost portion of the shield, the concentric cylinder having a second height and a second diameter, smaller than the first diameter; wherein the upper tier does not extend into the chamber past the distal portion of the first pair of filament elements and wherein the first diameter extends radially further than the distal portion of the filament elements such that the first diameter is greater than a distance between the negative leg and a corresponding second leg of each filament element and wherein the second diameter is smaller than the diameter of the circle formed by the first pair of filament elements.

2. The ion source of claim 1, wherein the ion source is a multicusp ion source and comprises magnets disposed along the walls.

3. The ion source of claim 1, wherein the shield is electrically connected to the negative leg such that the shield is a most negatively biased component in the chamber.

4. The ion source of claim 1, wherein the shield is electrically floating.

5. The ion source of claim 1, further comprising:
    an electrode disposed outside the chamber and proximate the extraction aperture, having an electrode aperture; and
    an electrode power supply to provide a voltage to the electrode.

6. The ion source of claim 5, wherein the electrode is biased positively relative to the chamber so as to attract negative ions and electrons through the extraction aperture.

7. The ion source of claim 1, wherein the shield comprises a round plate.

8. The ion source of claim 1, wherein the shield comprises a metal mesh or a plate comprising a plurality of holes.

9. An ion implantation system, comprising:
    the ion source of claim 1;
    a mass analyzer to receive ions extracted from the ion source; and
    a tandem accelerator to accelerate ions exiting the mass analyzer.

10. The ion source of claim 1, wherein the second height is less than a distance from the second end to the distal portions of the first pair of filament elements.

* * * * *